US010582576B2

(12) United States Patent
Specht et al.

(10) Patent No.: US 10,582,576 B2
(45) Date of Patent: Mar. 3, 2020

(54) GASKET ADAPTED FOR A MICROWAVE OVEN OR A COOKING OVEN WITH MICROWAVE HEATING FUNCTION AND A MICROWAVE OVEN OR A COOKING OVEN WITH MICROWAVE HEATING FUNCTION COMPRISING THE SAME

(71) Applicant: Electrolux Home Products Corporation N. V., Brussels (BE)

(72) Inventors: Trevor Specht, Rothenburg ob der Tauber (DE); Tobias Schutz, Rothenburg ob der Tauber (DE); Klaus Walzlein, Rothenburg ob der Tauber (DE); Michael Wittmann, Rothenburg ob der Tauber (DE); Benjamin Himmelein, Rothenburg ob der Tauber (DE)

(73) Assignee: Electrolux Home Products Corporation N.V., Brussels (BE)

( * ) Notice: Subject to any disclaimer, the term of this patent is extended or adjusted under 35 U.S.C. 154(b) by 965 days.

(21) Appl. No.: 14/762,168

(22) PCT Filed: Jan. 27, 2014

(86) PCT No.: PCT/EP2014/051487
§ 371 (c)(1),
(2) Date: Jul. 20, 2015

(87) PCT Pub. No.: WO2014/114783
PCT Pub. Date: Jul. 31, 2014

(65) Prior Publication Data

US 2015/0359048 A1 Dec. 10, 2015

(30) Foreign Application Priority Data

Jan. 25, 2013 (EP) .................................... 13152702
Jan. 25, 2013 (EP) .................................... 13152704
Oct. 23, 2013 (WO) ................ PCT/EP2013/072149

(51) Int. Cl.
*H05B 6/76* (2006.01)
*H05B 6/64* (2006.01)
*H05K 9/00* (2006.01)

(52) U.S. Cl.
CPC ......... *H05B 6/6405* (2013.01); *H05B 6/6414* (2013.01); *H05B 6/6426* (2013.01); *H05B 6/763* (2013.01)

(58) Field of Classification Search
CPC .... H05B 6/6405; H05B 6/763; H05B 6/6414; H05B 6/6426
(Continued)

(56) References Cited

U.S. PATENT DOCUMENTS 2,957,794 A * 10/1960 Shetterly ................ B32B 15/08 156/330
4,013,861 A 3/1977 Westfall
(Continued)

FOREIGN PATENT DOCUMENTS

EP 0430694 A1 6/1991
GB 1351457 A 5/1974

OTHER PUBLICATIONS

International Search Report for PCT/EP2014/051487, dated Mar. 13, 2014, 2 pages.

*Primary Examiner* — Quang T Van
(74) *Attorney, Agent, or Firm* — Pearne & Gordon LLP

(57) ABSTRACT

A gasket (20) adapted for a microwave oven or a cooking oven with microwave heating function, that includes at least one elastic material and includes a front portion (30) and a rear portion (32), wherein the front portion (30) of the gasket
(Continued)

Figure 1:
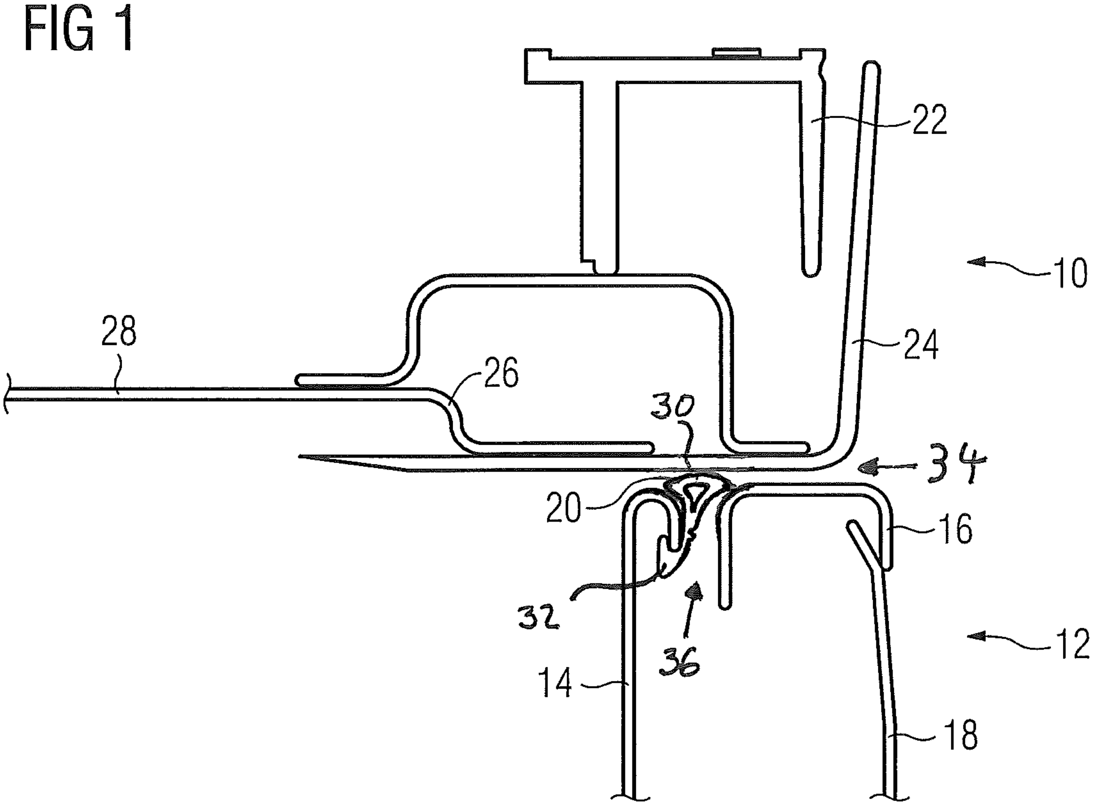

(20) is an electrically non-conductive material, whereas the rear portion (32) of the gasket (20) is an electrically conductive material.

12 Claims, 1 Drawing Sheet

(58) Field of Classification Search
USPC ....... 219/715, 738, 739, 740, 741, 742, 743, 219/756, 680; 174/361, 358, 377, 387; 361/816; 148/513; 156/330
See application file for complete search history.

(56) References Cited

U.S. PATENT DOCUMENTS

| | | | | |
|---|---|---|---|---|
| 4,046,983 | A | 9/1977 | Ishino et al. | |
| 4,059,742 | A * | 11/1977 | Baron | H05B 6/763 219/685 |
| 4,313,044 | A * | 1/1982 | Staats | H05B 6/763 174/361 |
| 4,734,140 | A * | 3/1988 | Tzeng | H05K 9/0015 148/513 |
| 2007/0035939 | A1 * | 2/2007 | Wallace | H05K 9/0015 361/816 |

* cited by examiner

GASKET ADAPTED FOR A MICROWAVE OVEN OR A COOKING OVEN WITH MICROWAVE HEATING FUNCTION AND A MICROWAVE OVEN OR A COOKING OVEN WITH MICROWAVE HEATING FUNCTION COMPRISING THE SAME

The present invention relates to a gasket adapted for a microwave oven or a cooking oven with microwave heating function. Further, the present invention relates to a microwave oven or a cooking oven with microwave heating function comprising the same.

A microwave oven generates electromagnetic fields in order to heat food stuff and beverages in the oven cavity. However, the strong electromagnetic fields generated by the microwave oven are a potential threat to the health of the operator, if said electromagnetic fields or parts of them leave the oven cavity. The oven door of the microwave oven is a critical part. In particular, the microwaves may leave the oven cavity through a gap between the oven door and the front frame enclosing the front opening of the oven cavity. Even low remaining field amplitudes staying inside the casing can cause problems on any electronic components of the microwave oven.

A further aspect is the energy consumption of the microwave oven. The increasing energy costs require microwave ovens with low energy consumption. In particular, cooking ovens with a microwave heating function and additional conventional heating functions should have minimal thermal losses.

It is an object of the present invention to provide an improved sealing and thermal isolation with a low complexity for a microwave oven and/or a cooking oven with microwave heating function.

The object of the present invention is achieved by the gasket for a microwave oven or for an oven according to claim 1.

The present invention relates to a gasket that is adapted for a microwave oven or a cooking oven with microwave heating function, that comprises at least one elastic material and includes a front portion and a rear portion, wherein the front portion of the gasket consists essentially of an electrically nonconductive material, whereas the rear portion of the gasket consists essentially of an electrically conductive material.

According to the present invention the gasket that includes two components, namely the front portion and the rear portion, wherein the front portion is made of an electrically nonconductive material, and the rear portion is made of a conductive material. It has been found that the front portion does not require an electrically conductive component, if the wave choke of a microwave oven or a cooking oven with microwave heating function is arranged inside the oven door. The wave choke is already sufficient to stop leakage via the oven door. Furthermore, the electrically non-conductive material is more resistant against mechanical and thermal stress and chemical attacks.

In particular, the front portion and the rear portion of the gasket extend in parallel each other and along the longitudinal axis of said gasket.

Preferably, the gasket comprises at least one silicone material.

For example, the rear portion of the gasket comprises at least one silicone material containing small metallic particles mixed into said silicone material.

In particular, the gasket is formed as a single-piece part.

Further, the wave choke may comprise a G-shaped cross section.

In this case, the gasket may extend in parallel to a slot of the G-shaped wave choke in the closed state of the oven door.

Furthermore, the door frame of a microwave oven or a cooking oven with microwave heating function may comprise a front door frame and a rear door frame, wherein the wave choke is arranged between the front door frame and the rear door frame.

Moreover, the rear door frame of a microwave oven or a cooking oven with microwave heating function may comprise an L-shaped cross section, wherein an outer wing encloses the oven door and an inner wing rests against the gasket in the closed state of the oven door.

For example, the front portion of the gasket according to the invention comprises a triangular cross section. In contrast, the rear portion of the gasket may have an L-shaped cross section.

Additionally, the oven door of a microwave oven or a cooking oven with microwave heating function may comprise a door grid enclosed by the wave choke and the door frame.

Further, a first gap may be formed between the front frame and the door frame of a microwave oven or a cooking oven with microwave heating function in the closed state of the oven door, wherein said gap extends in parallel to the plane of the oven door.

In particular, the first gap encloses the gasket of the present invention in the closed state of the oven door.

The first gap can have any suitable width that allows substantially to reach the aforementioned aims of the invention. For example, the gap can have a width in a range from about 0.1 mm to about 10 mm, in particular in a range from about 1 mm to about 5 mm, preferably a width between 2 mm and 3 mm, for example a width of 2.5 mm.

Further, a second gap may be formed between the front frame and a frontal opening of the oven cavity. The second gap can enclose at least partially a front opening of the oven cavity and the front frame can enclose the gap in turn. The front frame can be thermally decoupled from the oven cavity by the second gap in order to avoid energetic losses by heat conduction from the oven cavity to the front frame.

The second gap can have any suitable width that allows substantially to avoid heat conduction from the oven cavity to the front frame. For example, the gap can have a width in a range from about 0.1 mm to about 10 mm, in particular in a range from about 1 mm to about 5 mm, preferably a width between 2 mm and 3 mm, for example a width of 2.5 mm.

Further, the present invention relates to a microwave oven or a cooking oven with microwave heating function that comprises the gasket mentioned above.

The invention will be explained in more detail below by means of exemplary embodiments. Reference is thereby made to the drawings, wherein FIG. 1 illustrates a schematic partial sectional top view of an oven door and a chassis of a microwave oven with a gasket according to a preferred embodiment of the present invention, and FIG. 2 illustrates a schematic cross sectional view of the gasket of the invention that is adapted for arrangement in a first gap between a front frame and a rear door frame of the microwave oven.

Figure 2:
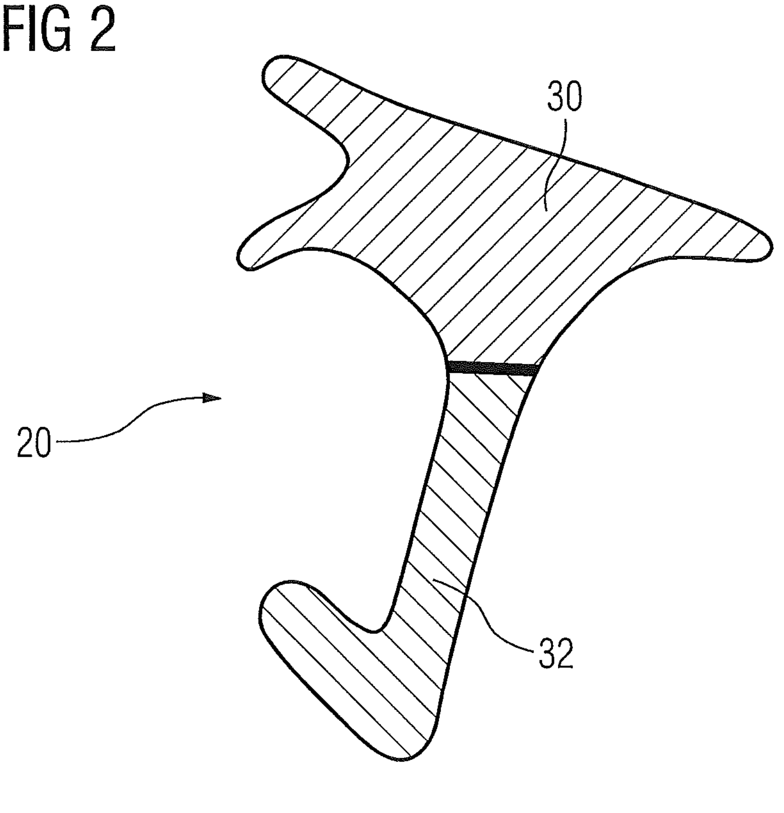

FIG. 1 illustrates a schematic partial sectional top view of an oven door 10 and a chassis 12 of a microwave oven with a gasket according to a preferred embodiment of the present invention.

The chassis 12 of the microwave oven comprises an oven cavity 14, a front frame 16 and side wall 18. The front frame 16 encloses a front opening of the oven cavity 14. The oven door 10 of the microwave oven comprises a front door frame 22, a rear door frame 24, a wave choke 26 and a door grid 28. The front door frame 22 has a U-shaped profile. The rear door frame 24 has an L-shaped profile.

The wave choke 26 is arranged between the front door frame 22 and the rear door frame 24. The front door frame 22, the rear door frame 24 and the wave choke 26 form a door frame of the oven door 10. The door frame encloses the door grid 28 of the oven door 10.

The wave choke 26 has a G-shaped cross section. A slot in said G-shaped cross section is arranged at the outer rear side of the wave choke 26. Said slot encloses the oven door 10. The wave choke 26 comprises a plurality of lamellae. The slot in the G-shaped cross section is covered by the rear door frame 24.

A first gap (34) between the front frame 16 of the chassis 12 and the rear door frame 24 of the oven door 10 extends in parallel to the plane of the oven door 10. In this example, the first gap (34) has a thickness of about 2.5 mm.

A gasket 20 is arranged in a second gap (36) between the oven cavity 14 and the front frame 16. In a closed state of the oven door 10 the gasket 20 covers partially the slot in the G-shaped cross section of the wave choke 26. The gasket 20 closes the first gap (34) between the front frame 16 of the chassis 12 and the rear door frame 24 of the oven door 10.

The gasket 20 consists essentially of two components, namely a front portion 30 and a rear portion 32. The front portion 30 of the gasket 20 is made essentially of an electrically nonconductive material. In contrast, the rear portion 32 of the gasket 20 is made essentially of a conductive material. The gasket 20 is provided for sealing the first gap (34) between the oven door 10 and the front opening of the oven cavity 14 against microwaves on the one hand and against steam, grease, hot air and humid air on the other hand.

FIG. 2 illustrates a schematic cross sectional view of the gasket 20 provided for the first gap (34) between the front frame 16 and the rear door frame 24 of the microwave oven according to the preferred embodiment of the present invention. The gasket 20 comprises one or more elastic materials.

The gasket 20 includes the front portion 30 and the rear portion 32. The front portion 30 has substantially a triangular cross section. The rear portion 32 has an L-shaped cross section. A hook of the L-shaped cross section of the rear portion 32 is engaged with a border of the oven cavity 14 as shown in FIG. 1. The front portion 30 is made essentially of the electrically nonconductive material, while the rear portion 32 is made essentially of the conductive material.

It has been found that the front portion 30 does not require an electrically conductive component, if the wave choke 26 is inside the oven door 10. The wave choke 26 is already sufficient to stop leakage via the oven door 10. The electrically nonconductive material allows a higher resistance against mechanical and thermal stress and chemical attacks. In addition, it has been found that the rear portion (32) of the gasket that consists essentially of an electrically conductive material can effectively stop any microwave leakage into the housing of the microwave oven if it is arranged inside a second gap (36) that is formed between the oven cavity (14) and the front frame (16) that encloses circumferentially at least part of the front opening of the oven cavity (14).

For example, the gasket 20 is made of different silicone materials. The front portion 30 of the gasket 20 may be made of a silicone material containing small metallic particles mixed into said silicone material. Two different silicone materials are available under the trade names "THERMIC-50-HT/T/FG" and "DUCOSIL-68/T", wherein one of them includes the small metallic particles mixed into the silicone material. The electrically non-conductive material is more resistant against mechanical and thermal stress and chemical attacks.

The gasket 20 provides tightness for microwaves to the inner oven and to the oven door 10. The front portion (30) of the gasket 20 provides tightness regarding steam and other substances occurring in an oven. Moreover, the front part (30) of the gasket 20 allows a compensation of tolerances of the first gap (34) between the oven door 10 and the front frame 16. A special wave choke system in the first gap (34) is not required. An additional steam gasket for the first gap (34) is not necessary. The rear portion (32) of the gasket 20 provides tightness regarding steam and other substances occurring in an oven towards the oven housing that comprises the electrical components of the oven. Moreover, the rear part (32) of the gasket 20 allows a compensation of tolerances of the second gap (34) between the oven cavity 14 and the front frame 16. A special wave choke system in the second gap (36) is not required, because the rear part (32) of the gasket (20) consists essentially of electrically conductive material. An additional steam gasket for the second gap (36) is not necessary. Thus, the gasket 20 minimizes microwave leakage via both the first gap (30) and the second gap (329 by low complexity.

Although an illustrative embodiment of the present invention has been described herein with reference to the accompanying drawing, it is to be understood that the present invention is not limited to that precise embodiment, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS

10 oven door
12 chassis
14 oven cavity
16 front frame
18 side wall
20 gasket
22 front door frame
24 rear door frame
26 wave choke
28 door grid
30 front portion of the gasket
32 rear portion of the gasket
34 first gap
36 second gap

The invention claimed is:

1. A gasket adapted for a microwave oven or a cooking oven with microwave heating function, the gasket comprising at least one elastic material and including a front portion and a rear portion, wherein the front portion of the gasket consists essentially of an electrically non-conductive material, whereas the rear portion of the gasket consists essentially of an electrically conductive material comprising at least one silicone material containing small metallic particles mixed into said silicone material, wherein the gasket is formed as a single-piece part.

2. The gasket according to claim 1, wherein the front portion and the rear portion of the gasket extend in parallel to each other and along a longitudinal axis of said gasket.

3. The gasket according to claim 1, wherein the gasket comprises at least one silicone material.

4. The gasket according to claim 1, wherein the gasket is adapted for a microwave oven or a cooking oven with microwave heating function that comprises a front frame that encloses circumferentially at least a part of a front opening of an oven cavity, an oven door that is provided for covering the front opening of the oven cavity and at least partially the front frame, wherein said gasket is an elongated gasket that is attached between the front frame, and said oven door in a closed state rests against said front portion of the gasket.

5. The gasket according to claim 4, wherein the oven door comprises a door frame enclosing said oven door and a wave choke that is arranged inside the door frame and encloses the oven door.

6. The gasket according to claim 4, wherein a first gap is formed between the front frame and the door frame in the closed state of the oven door, wherein said first gap extends in parallel to the plane of the oven door, and wherein the first gap encloses the front portion of the gasket in the closed state of the oven door.

7. The gasket according to claim 1, wherein the front portion of the gasket comprises a triangular cross section.

8. The gasket according to claim 1, wherein the gasket is adapted for a microwave oven or a cooking oven with microwave heating function that comprises a front frame that encloses circumferentially at least a part of a front opening of an oven cavity, wherein said gasket is an elongated gasket and said rear portion of the gasket is attachable between the oven cavity and the front frame.

9. The gasket according to claim 8, wherein a second gap is formed between the oven cavity and the front frame that encloses circumferentially at least a part of a front opening of an oven cavity, wherein the rear portion of the gasket is adapted for arrangement inside said second gap.

10. The gasket according to claim 1, wherein the rear portion of the gasket comprises an L-shaped cross section.

11. A microwave oven or a cooking oven with microwave heating function comprising a gasket according to claim 1.

12. The gasket according to claim 1, where both the front portion and the rear portion comprise the at least one elastic material.

* * * * *